United States Patent
Moriceau et al.

(10) Patent No.: US 10,651,032 B2
(45) Date of Patent: May 12, 2020

(54) METHOD FOR PRODUCING AN EPITAXIAL LAYER ON A GROWTH PLATE

(71) Applicant: COMMISSARIAT A L'ENERGIE ATOMIQUE ET AUX ENERGIES ALTERNATIVES, Paris (FR)

(72) Inventors: Hubert Moriceau, Saint-Egreve (FR); Matthew Charles, Grenoble (FR); Christophe Morales, St Pierre de Mesage (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/324,399

(22) PCT Filed: Jul. 25, 2017

(86) PCT No.: PCT/EP2017/068807
§ 371 (c)(1),
(2) Date: Feb. 8, 2019

(87) PCT Pub. No.: WO2018/028982
PCT Pub. Date: Feb. 15, 2018

(65) Prior Publication Data
US 2019/0206678 A1   Jul. 4, 2019

(30) Foreign Application Priority Data

Aug. 11, 2016   (FR) ...................................... 16 57712

(51) Int. Cl.
*H01L 21/02*   (2006.01)
*H01L 21/20*   (2006.01)
*H01L 21/683*   (2006.01)

(52) U.S. Cl.
CPC .. *H01L 21/02639* (2013.01); *H01L 21/02043* (2013.01); *H01L 21/0254* (2013.01);
(Continued)

(58) Field of Classification Search
None
See application file for complete search history.

(56) References Cited

U.S. PATENT DOCUMENTS 5,863,829 A *   1/1999   Nakayoshi .......... H01L 21/2007
                                                              216/20
9,245,736 B2 *  1/2016   Ziad .................. H01L 21/02598
(Continued)

OTHER PUBLICATIONS

International Search Report dated Oct. 30, 2017 in PCT/EP2017/068807 filed on Jul. 25, 2017.

*Primary Examiner* — Bradley Smith
(74) *Attorney, Agent, or Firm* — Oblon, McClelland, Maier & Neustadt, L.L.P.

(57) ABSTRACT

The present invention relates to the controlling of the deposition quality of an epitaxial layer, for example of gallium nitride, on a growth plate, for example of silicon, in particular at the level of the edges of the plate. The invention aims, in particular, to reduce the complexity and the production cost of known solutions. The production method according to the invention highlights the existence of a chamfer on each growth plate and provides a self-positioned deposition of a protective film on at least one part of the chamfer using a mechanical mask, preventing the deposition of the protective film on the useful zone Zu through epitaxy.

18 Claims, 3 Drawing Sheets

(52) U.S. Cl.
CPC .... *H01L 21/0262* (2013.01); *H01L 21/02381* (2013.01); *H01L 21/02658* (2013.01); *H01L 21/2007* (2013.01); *H01L 21/6835* (2013.01); *H01L 21/0217* (2013.01); *H01L 21/02164* (2013.01); *H01L 2221/68381* (2013.01)

(56) References Cited

U.S. PATENT DOCUMENTS

| | | |
|---|---|---|
| 10,199,216 B2 * | 2/2019 | Ostermaier ....... H01L 21/02381 |
| 2012/0034768 A1 | 2/2012 | Sato |
| 2012/0083098 A1 | 4/2012 | Berger et al. |
| 2013/0069072 A1 | 3/2013 | Tomabechi |
| 2014/0335676 A1 | 11/2014 | Berger et al. |
| 2015/0028457 A1 | 1/2015 | Shikauchi et al. |
| 2016/0086844 A1 | 3/2016 | Berger et al. |
| 2019/0067081 A1 * | 2/2019 | Gardner ............. H01L 29/2003 |

* cited by examiner

METHOD FOR PRODUCING AN EPITAXIAL LAYER ON A GROWTH PLATE

TECHNICAL FIELD OF THE INVENTION

The present invention relates to the quality control for forming an epitaxial layer on a growth plate, in particular at the level of the edges of the plate. The invention will find, as an advantageous, but non-limiting application, the formation of a gallium nitride layer by epitaxy on a silicon plate.

The fields of application of this type of deposits are in particular the production of microelectronic components, such as electrical power components, radiofrequency components, components for lighting, etc.

STATE OF THE ART

There is a real quality problem in deposits of gallium nitride or more generally alloy films of columns III and V of the periodic table of elements, in particular on the edges of silicon plates which are used as mechanical support and crystalline germs. Known solutions consist of making monocrystalline films grow through epitaxy, through conventional growth techniques, for example in microelectronics, among which metalorganic chemical vapour epitaxy (MOVPE) can be cited.

Currently, growth defects or parasitic deposits appear on the edges of silicon plates. These growth defects are in particular due to the change in crystalline orientation at the level of the edges of the plate. These growth defects or parasitic deposits are the particle source which can be detached from the edges of the silicon plate during the method steps after the deposition of gallium nitride. Also, the friction of the edges of silicon plates in cassettes, for example during the handling thereof in a white room, can quickly degrade the environment of said cassettes.

To resolve this problem, the conventional solution consists of protecting the edges of plates by implementing the following method:
- depositing a protective film on a face of the silicon plate;
- depositing a film of a photosensitive resin on the protective film;
- producing, by photolithography, an opening in the photosensitive resin film to define, on said face of the silicon plate, a first surface exposed and delimited by what remains of said at least one photosensitive resin film;
- etching the protective film perpendicular to said first surface,
- depositing, through epitaxy, a gallium nitride film perpendicular to said first surface;
- removing what remains of the protective film, in particular on the edges of the silicon plate.

However, this solution is not satisfactory for the following reasons.

At least four technological steps (deposition, resin layering, photolithography, etching) are needed to achieve the superficial protection of the edges of the silicon plate and the opening defining the first surface which constitutes the useful zone Zu at the deposition, through epitaxy, of the gallium nitride film. Known methods are therefore relatively complex and expensive.

Moreover, the lithography used to define the useful zone Zu currently involves a relatively large exclusion zone Ze (extending typically over 1 to 3 mm) on the edges of the silicon plate. It ensues that a significant surface of the growth substrate is not profitable.

Furthermore, the etching (in one or more steps) of the protective film perpendicular to the useful zone Zu can cause damage to the surface or under the surface in this zone, according to the nature of the protective films. This damage can be sources of defects during the deposition through epitaxy of the gallium nitride film perpendicular to the useful zone Zu.

The aim of the invention is to meet, at least partially, the limitations outlined above.

SUMMARY OF THE INVENTION

To achieve this aim, according to an embodiment, the present inventions provides a method for producing an epitaxial layer on a growth plate comprising steps consisting of:
- Providing a masking substrate;
- Providing at least one growth plate, each growth plate comprising a chamfer on at least one edge;
- Adhering at least one growth plate on the masking substrate, such that the masking substrate masks a first surface and exposes a second surface of said at least one growth plate, said second surface comprising the chamfer and said first surface being at least partially delimited by the chamfer;
- Depositing at least one protective film at least on one part of the chamfer of said at least one growth plate, the deposition of said at least one protective film being done via a method making it possible to cover at least partially the chamfer of the growth plate;
- Removing said at least one growth plate from the masking substrate, said at least one protective film exposing and thus delimiting the first surface of the silicon plate because of the masking of said first surface by the masking substrate during the deposition of said at least one protective film; and
- Depositing an epitaxial layer from said first surface of said at least one growth plate.

Thus, the method according to the invention cleverly uses the chamfer usually present on the growth plates in order to self-position the protective film on the chamfer while avoiding positioning it on the first surface, because of the masking thereof by the masking substrate. Indeed, to the right of the chamfer, the masking chamfer is remote from the growth plate. Therefore, there is, to the right of the chamfer, an accessible space on which the species forming the protective film can be deposited during the formation of the protective film. After removal, the epitaxial growth is reduced, even avoided, at the level of the chamfer covered with protective film while the growth can occur at the level of the first surface as the first surface is not covered by the protective film.

Thus, the method according to the invention makes it possible for the production of an epitaxial layer, for example of gallium nitride, on at least one growth plate, for example a silicon plate, by not requiring any photolithography step. The method according to the invention thus makes it possible to reduce the complexity and the cost of known solutions.

Moreover, the method according to the invention makes it possible to produce an epitaxial layer by maximising the useful zone Zu used for the growth through epitaxy on each growth plate, this maximisation of the useful zone being the consequence of minimising the exclusion zone Ze which extends, at most, over the chamfer of the growth plate. With respect to known solutions, for one same surface of the growth plate, the method according to the invention thus makes it possible to produce a larger epitaxial layer surface. The production cost of the epitaxial layer is therefore reduced.

According to another embodiment, the present invention provides a method for producing an epitaxial layer on a growth plate comprising steps consisting of:

providing two growth plates, each growth plate comprising a chamfer on at least one edge;

adhering the two growth plates on top of one another, such that each growth plate masks a first surface and exposes a second surface of the other growth plate; the second surface of each growth plate comprises the chamfer of this growth plate and the first surface of each growth plate is at least partially delimited by the chamfer of this growth plate;

depositing at least one protective film on a part of the chamfer of at least one of the two growth plates, the deposition of said at least one protective film being done via a method making it possible to cover at least partially the chamfer of the growth plate;

removing said two growth plates from one another, said at least one protective film exposing and delimiting the first surface of one of the two growth plates, because of the masking of said first surface by the other of the two plates during the deposition of said at least one protective film; and depositing an epitaxial layer from the first surface of said at least one of the two growth plates.

In this embodiment, one of the two growth plates is used as a masking substrate for the other of the two growth plates, and vice versa. The useful zone Zu of one of the two growth plates is masked at the deposition of the protective film by the other of the two growth plates.

Thus, the method according to the invention makes it possible to produce an epitaxial layer together on two growth plates by requiring no photolithography step and by maximising the useful zone Zu on which the layer is epitaxial.

This embodiment makes it possible to also reduce even more the time and the cost for obtaining a large epitaxial layer surface.

Thus, the invention is particularly advantageous for producing microelectronic components, such as electrical power components, radiofrequency components, components for lighting, etc.

By microelectronic component, this means any type of device made with microelectronic means. These devices in particular additionally comprise devices for purely electronic purposes, micromechanical or electromechanical devices (MEMS, NEMS, etc.), as well as optical or optoelectronic devices (MOEMS, etc.).

Other aims, characteristics and advantages of the present invention will appear upon examining the following description and supporting drawings. It is understood that other advantages can be incorporated.

BRIEF DESCRIPTION OF THE FIGURES

The goals, aims, as well as the characteristics and advantages of the invention will best emerge from the detailed description of an embodiment of the latter which is illustrated by the following supporting drawings, wherein.

The drawings are given as examples and are not limiting of the invention. They constitute schematic representations of principle intended to facilitate the understanding of the invention and are not necessarily to the scale of practical applications. In particular, the relative thicknesses of the different layers and films are not representative of reality.

Optionally, the invention can furthermore have at least any one of the following optional characteristics:

the masking substrate can be of dimensions greater than the dimensions of said at least one growth plate such that several growth plates can be adhered on the masking substrate, and preferably the masking substrate is reusable to successively carry out several sequences of steps with different growth plates, each sequence comprising at least said adhesion and said removal. Thus, the substrate is reusable to implement, at least once more, the production method by again providing at least one growth plate.

the masking substrate can be transparent to make it possible to remove, by application of a radiation, preferably laser, at least on one part of said first surface through the masking substrate.

the adhesion is done such that said first surface exposed and delimited by said at least one protective film is maximal.

the adhesion can be done by direct adhesion.

said at least one protective film comprises at least one nitride film, preferably a silicon nitride film or an oxide film, preferably a silicon oxide film.

the method can comprise, before adhering the growth plate on the masking substrate, a step consisting of depositing at least one nucleation layer comprising a film of a nitride, for example selected from among aluminium nitride (AlN), indium nitride (InN), aluminium-gallium nitride (AlGaN), indium-gallium nitride (InGaN) at least on the first surface of the growth plate. The later deposition of the epitaxial layer is thus enabled by a selective growth phenomenon.

the method can comprise:

before the adhesion step, a step consisting of generating an additional layer, at least perpendicular to the first surface of said at least one growth plate; the generation of the additional layer preferably comprises one from among an oxidation in the surface of said at least one growth plate and a deposition of the additional layer; and after the removal of said at least one growth plate from the masking substrate and before the step of depositing the epitaxial layer, a step consisting of removing the additional layer perpendicular to said first surface exposed and delimited by said at least one protective film; the removal of said additional layer perpendicular to said first surface preferably comprises the wet etching thereof selectively at the protective film, for example by a hydrofluoric acid solution.

furthermore, the method can comprise, before the generation of the additional layer, a step consisting of depositing at least one nucleation layer comprising a film of a nitride selected from among aluminium nitride (AlN), aluminium-gallium nitride (AlGaN), silicon carbide (SiC) at least on the first surface of said at least one growth plate; the generation of the additional layer can be done by the deposition thereof at least perpendicular to said first surface.

adhering said at least one growth plate on the masking substrate can be preceded by a smoothing, and preferably a cleaning, of the additional layer at least perpendicular to said first surface.

furthermore, the method can comprise, after adhering said at least one growth plate on the masking substrate and before the deposition of the epitaxial layer, a step consisting of removing the additional layer perpendicular to said second surface; the removal of said additional layer perpendicular to said second surface preferably comprises the etching thereof selectively to the protective film, for example by a hydrofluoric acid solution; and the adhering of said at least one growth plate on the masking substrate preferably comprises a heat treatment to reinforce the adhesion and thus avoid the infiltration of a chemical attack solution perpendicular to said first surface during the selective etching of the additional layer.

the masking substrate can comprise vias to make it possible to supply, up to the additional layer situated perpendicular to the first surface, a chemical attack solution of the additional layer. The method thus makes it possible for a chemical removal of the growth plate from the masking substrate.

Moreover, and also optionally, the invention can furthermore have at least any one of the following optional characteristics:

the step of depositing said at least one protective film comprising the deposition of said at least one protective film on a rear face of the growth plate opposite a front face comprising said first surface, the method can further comprise, after the removal of said at least one growth plate from the masking substrate and before the step of depositing the epitaxial layer, a step consisting of removing, from said rear face, at least said at least one protective film up to exposing a third surface of the growth plate opposite said first surface, this third surface possibly remaining delimited by what remains of the protective film on at least one edge of the growth plate; this removal preferably comprises the mechanical removal by grinding at least said at least one protective film at least perpendicular to said third surface.

the deposition of the epitaxial layer can be preceded with a cleaning of at least the first surface of said at least one growth plate.

the method can further comprise, after the step of depositing the epitaxial layer, a step consisting of removing at least what remains of said at least one protective film up to exposing the whole surface of the growth plate not covered by the epitaxial layer.

the removal of what remains of said at least one protective film can preferably comprise the wet etching selectively at the protective film, for example a hydrofluoric acid solution, from what remains of the additional layer; this removal is preferably preceded by at least one opening of said at least one protective film to make it possible to supply said chemical attack solution.

the epitaxial layer covering, with the edges thereof partially said at least one protective film, itself covering the chamfer, the method can further comprise, after the removal of what remains of said at least one protective film, a step consisting of removing the edges of the epitaxial layer, for example by grinding, followed preferably by a chemical attack, specific to correcting the imperfections of the grinding.

The additional layer can comprise a silicon oxide layer which has, in particular the interest of being able to be attacked by wet etching, selectively at a silicon nitride film which would compose at least partially said at least one protective film; it is now possible to remove said at least one protective film by the lifting thereof during the removal by wet etching of the additional layer which underlies said at least one protective film.

DETAILED DESCRIPTION OF THE INVENTION

It is specified that in the scope of the present invention, the term "on" or "cover(s)/covering" or "underlie(s)/underlying" or the equivalents thereof do not necessarily mean "in contact with". Thus, for example, the deposition of a first layer on a second layer, does not compulsorily mean that the two layers are directly in contact with one another, but this means that the first layer covers at least partially the second layer by either being directly in contact with it, or by being separated from it by at least one other layer.

It is understood by depositing, generating or removing something "perpendicular to" a surface, the action of depositing, generating or removing something on or from a zone situated at least partially opposite said surface, such that said zone is substantially flat if said surface is flat and such that said zone follows the variations of said surface, and if the latter is not flat; in other words, each straight line, perpendicular to said surface, has a point or a segment belonging to said zone.

By "direct adhering/adhesion", this means adhering without adding any adhesive material (or glue or polymer type, in particular), which consists of the putting into contact of relatively smooth surfaces, for example done at ambient temperature and under ambient atmosphere, in order to create an adhesion between them.

According to an embodiment, the direct adhering of two components means that the adhesion is obtained by chemical bonds which are established between the two surfaces put into contact. These two surfaces have sufficiently low roughness, such that the Van der Waals forces ensure, preferably only on these, that the two components are held together.

Direct adhesion is furthermore obtained without requiring the application of a significant pressure on the structure to be assembled. A slight pressure can simply be applied locally to initiate the adhesion.

Direct adhesion involves (or not) an intermediate adhering layer (for example, a silicon oxide layer).

In the scope of the invention, it can relate to the direct adhesion of two substrates having, at the surface, materials of the same type, typically two silicon (Si) plates or two substrates of which the faces in contact are each covered with a layer of the same type, typically an oxide film. The faces to be assembled can also be of different types insofar as they are compatible with a direct adhesion.

By "nucleation layer", this means a layer of which the properties favour the growth through epitaxy of a layer that is sought to be grown.

The method according to the invention will now be described, in reference to FIGS. 1 to 5.

Figure 3:
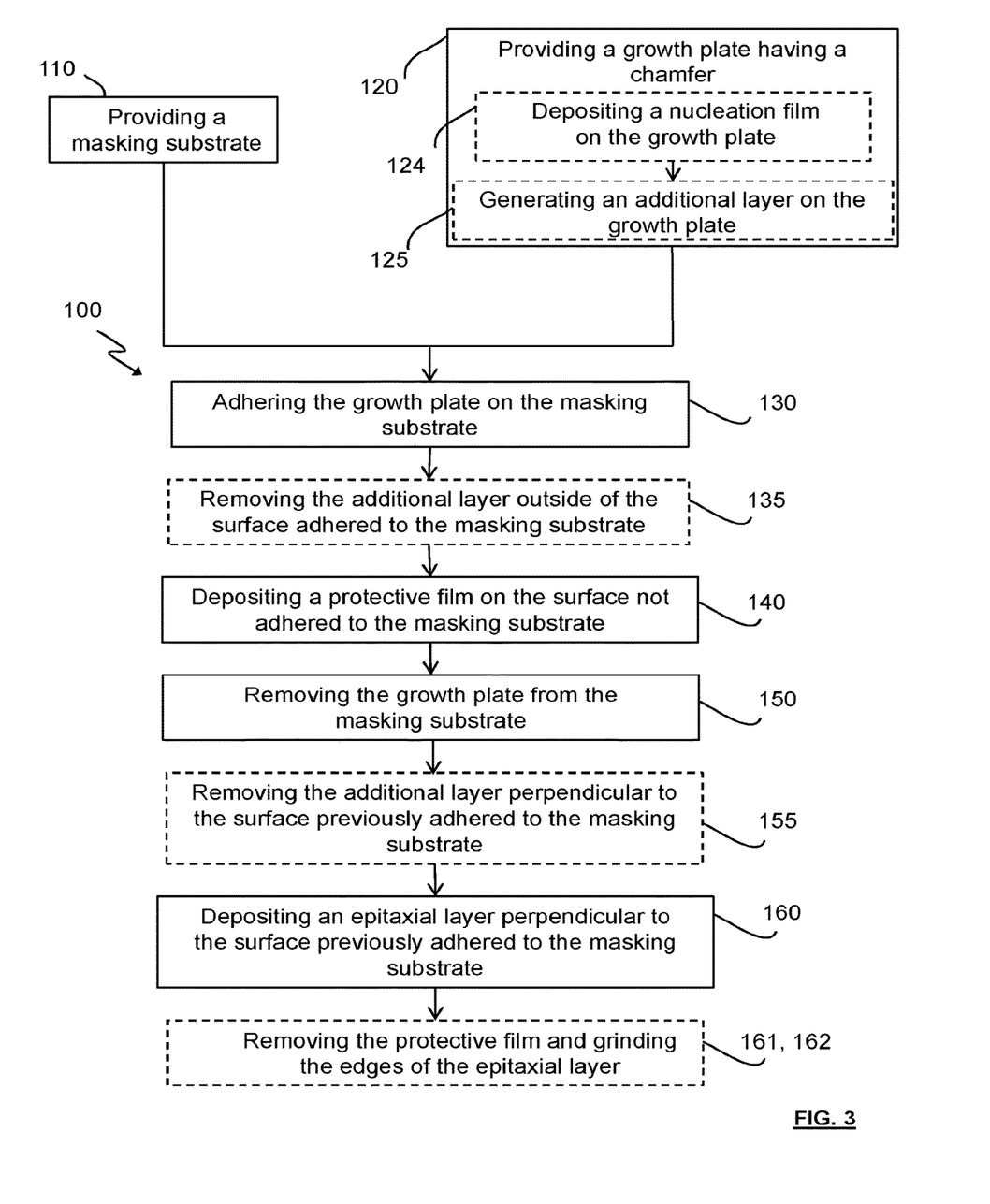
FIG. 3 is a flowchart of different steps of the production method according to an embodiment of the invention.

In reference to FIG. 3, on which the steps represented in dotted frames are optional, the production method first comprises steps consisting of:
providing 100 a masking substrate 1,
providing 120 at least one growth plate 2.

The growth plate 2 will be used as a support through epitaxy of the useful layer. Typically, the growth plate 2 is a silicon (Si) plate, or silicon-based plate. Preferably, the growth plate 2 is monocrystalline. Such a growth plate is often qualified by the word, "wafer".

Each growth plate 2 can take the shape of a disc having at least one thickness of around 1 mm, a diameter of 200 or 300 mm, and at least one face having a crystalline orientation [111]. However, the shape of each growth plate 2 is not at all limiting; the growth plate 2 can also be of a parallelepiped shape, for example. Preferably, the plate 2 has a front face 25 and a rear face 26, substantially flat.

According to certain embodiments of the production method 100, the masking substrate 1 is itself a growth plate 2, for example a silicon plate, preferably monocrystalline, comprising a chamfer 20 on at least one edge.

Figure 4:
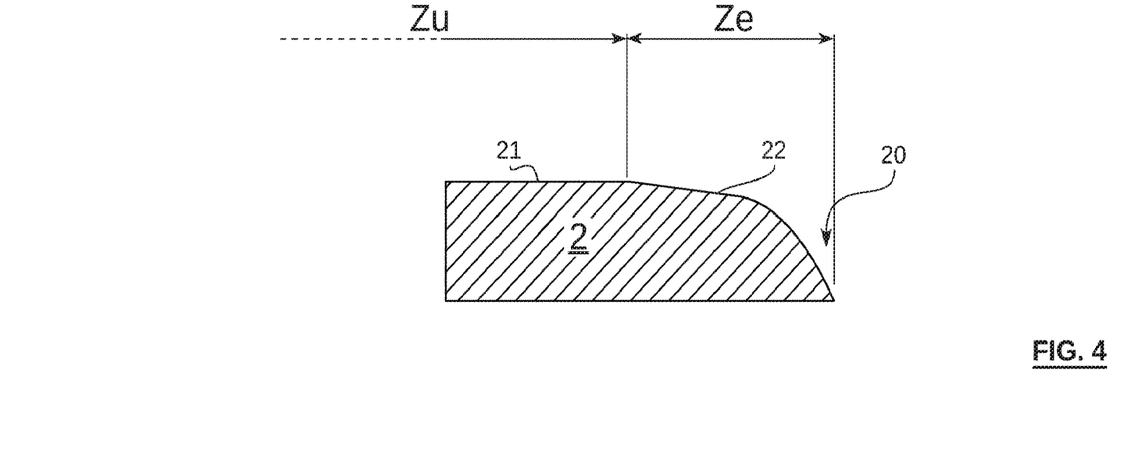
FIG. 4 is a schematic, cross-sectional view of a chamfered edge of a silicon plate.

In reference to FIG. 4, at least one chamfer 20 of each growth plate 2 extends over at least one edge, and preferably over the whole edge of the growth plate 2. It thus defines a perimeter on the front face 25 of the growth plate 2.

The type of chamfer 20 described below can be produced in a known manner, even standardised manner, in particular because a right edge (non-chamfered) would show a certain fragility that is sought to be avoided. The type of chamfer 20 described below is not limited by any requirement of standard(s); in particular, the shape thereof and the dimensions thereof can be optimised, within the limits of the general knowledge of a person skilled in the art, for a use according to the production method of the invention.

The chamfer 20 of each growth plate 2 preferably extends from at least one face of each growth plate 2. Each chamfer 20 can extend more specifically over an edge of the growth plate 2 from at least one substantially flat face, front 25 and/or rear 26, of the growth plate 2. This extension can take the shape of a regular subsidence over around 200 µm, then can take the shape of a sudden subsidence up to joining the edge of the growth plate 2 situated in the thickness thereof, said incidents of subsidence being to be considered with respect to a continued extension of the substantially flat face of the growth plate 2 from which the chamfer 20 extends. The chamfer 20 of each growth plate 2 can extend, for example, over around 0.5 mm in length over the edge of the growth plate 2 or equivalently from a face of the growth plate 2.

Each chamfer 20 of each growth plate 2 can therefore delimit a substantially flat front 25 or rear 26 face of this growth plate 2. Each substantially flat face delimited by a chamfer 20 can correspond to a first surface 21 of the growth plate 2. Each chamfer 20 extends, by definition, over a second surface 22 of the growth plate 2. The first and second surfaces of each growth plate 2 are not necessarily complementary to one another to form the whole surface of the growth plate 2. Each growth plate 2 can comprise two first surfaces 21 corresponding to the substantially flat front 25 and rear 26 faces of the growth plate 2 and a second surface 22 extending from and between said two first surfaces 21; the second surface 22 thus comprises two chamfers 20 extending respectively from each substantially flat face 25, 26 of the growth plate 2.

Insofar as the growth plates 2 are produced conventionally and therefore provided with a chamfer 20 of the type described above, the production method 100 according to the invention makes it possible to advantageously use the existence of this chamfer 20 to achieve the aims set.

To achieve the aims thereof, the invention provides a deposition 140 of at least one protective film 3 in the presence of a masking substrate 1 acting as a mechanical mask.

Figure 1:
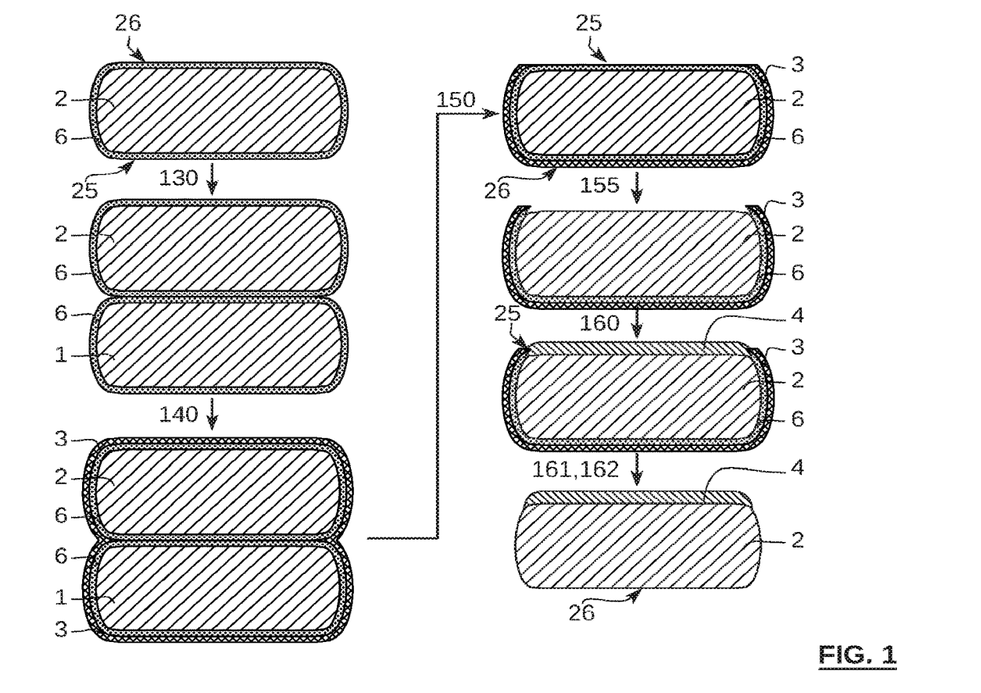
FIG. 1 is a schematic representation of different steps of a production method according to an embodiment of the invention.
Figure 2:
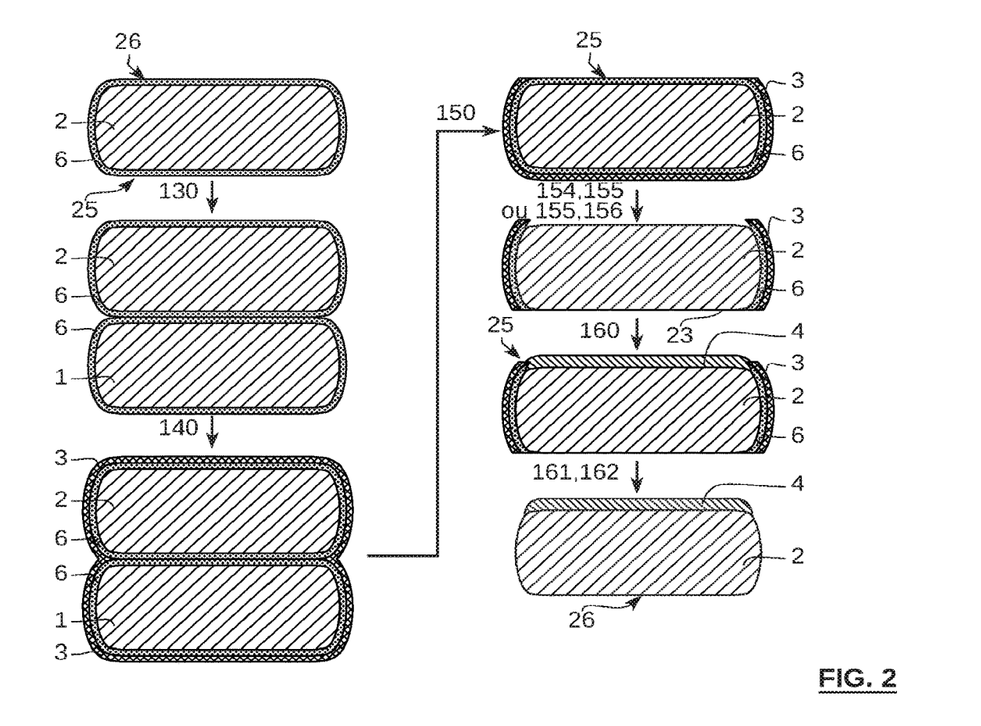
FIG. 2 is a schematic representation of different steps of a production method according to another embodiment of the invention.

According to the embodiments illustrated by FIGS. 1 and 2, the mechanical mask is produced from an adhering 130 of a first growth plate 2 on a second growth plate 2. One of the advantages of this approach, according to which the masking substrate 1 is a growth plate 2, is the possible concurrent preparation of two growth plates 2 for the future epitaxy 160. Preferably, but in a non-limiting manner, the two growth plates 2 have the same shape and dimensions.

The adhesion 130 can be achieved by a technique called direct adhesion, consisting of putting two surfaces into close contact, here preferably two first surfaces 21 without adding any adhesive material. In this non-limiting example, the two growth plates 2 are preferably silicon plates.

Under these conditions, the chamfers 20 of each of the two silicon plates 2 are too far away from one another to make it possible for an adhesion between them. This zone, where the adhesion of the silicon plates 2 is not possible, is thus accessible for the deposition 140 of a protective film 3. It can be considered straight away that the chamfers 20 of the two silicon plates 2 are distant by a few nanometres (typically by a distance of between 5 and 10 nm), the two silicon plates are no longer in contact and the deposition 140 of the protective film 3 will be effective here.

The separation of the adhered surfaces is then proceeded with, so as to remove the useful zones wherein the epitaxy can selectively be done. These useful zones are defined by the localised deposition 140 of the protective film 3: thus, any lithography step of the production thereof is avoided. By nature, the useful zone Zu extends over at least the whole of a substantially flat face of the or of each silicon plate 2 (corresponding, by definition, to a first surface 21 of the silicon plate 2) and potentially over a part of the chamfer 20 (not covered by the protective film 3).

An approach is described here, as an example and in reference to FIGS. 1 to 3, which comprises the generation 125 of an additional layer 6 for example of $SiO_2$, AlN, SiC, or AlGaN, and the deposition 140 of the protective film 3, for example of nitride or of oxygen.

The role of the additional layer 6 is at least one from among those consisting of:
protecting the future useful zone Zu through epitaxy 160,
favouring a direct adhesion 130, with conventional microtechnological means, of the two silicon plates 2 to one another (or more generally of a growth plate 2 on the masking substrate 1),
making it possible to obtain an adhesion 130 with a low adhesion energy, therefore an adhesion which can be disassembled without any removal, in the useful zone Zu,
making it possible to adapt the adhesion energy 130, for example by modifying the topology or the roughness of the surface to be adhered,
making it possible to absorb the possible gaseous species deaerated during the heat treatments undergone by the adhered structure, these heat treatments being involved at least in the deposition 140 of the protective film 3, being used as a nucleation layer through epitaxy (if the additional layer is made of AlN, SiC or AlGaN).

Furthermore, if the additional layer 6 is made of AlN, SiC or AlGaN and the protective film 3 made of oxide, a selective GaN growth can be obtained on this additional layer. The oxide layer will remain bare and can thus either be conserved, or easily removed.

If the additional layer 6 is made of oxide and the protective film 3 made of nitride, during the deposition 160 of the epitaxial layer, a low-quality deposition can be formed on the protective film 3 which can advantageously be removed 161 by lift-off thanks to the presence of the additional layer 6 only being present under the protective film. The corresponding process will be detailed below.

More specifically, the removal 161 can be obtained by wet etching using, for example, a hydrofluoric acid solution, from what remains of the additional layer 6 leading to the removal of the protective film 3 and of the underlying low-quality deposition. The removal 161 can furthermore preferably be preceded by the production of at least one opening of the protective film 3 to make it possible to supply up to the additional layer 6 of the etching solution.

Using a hydrofluoric acid solution is advantageous as this solution engraves the silicon oxide film 6 and does not engrave the protective film 3 made of silicon nitride, nor the epitaxial layer 4 and the possible nucleation layer.

The role of the protective film 3 is at least one from among those consisting of:
- producing an interactive barrier effect to avoid the formation of parasitic phases from gallium and silicon nitride,
- when the protective film is made of silicon nitride and is only deposited 140 on the chamfer 20, making it possible to remove 155 the additional oxide layer 6 perpendicular to said first surface 21 exposed and delimited by the protective film 3, while protecting the chamfer; this removal 155 thus comprises, for example, simply the wet etching of the additional layer 6 perpendicular to said first surface 21 by a chemical attack solution, for example a hydrofluoric acid solution.

After having described in detail, the additional layer 6 and the protective film 3, the different steps of the method according to the invention will now be described in reference to FIGS. 1 to 3. In this example, the masking substrate 1 and the growth plate 2 are made of silicon and the epitaxial layer 4 is a gallium nitride film without these materials being limiting of the invention. For example, the epitaxial layer can be an aluminium nitride (AlN) film.

Starting from two silicon plates 2, on the surface of at least one of these plates, and more specifically at least perpendicular to the first surface 21 of at least one of these plates, an additional silicon oxide layer 6 is generated 125, for example by thermal oxidation in a furnace. The two plates 2 are intended to be adhered 130 to one another by the surfaces of the respective silicon oxide layer 6 thereof. The surfaces to be adhered can advantageously be prepared to make it possible for a direct adhesion: they can undergo, in particular, smoothing steps, for example by chemical-mechanical polishing known by the acronym CMP, to achieve the required roughness, as well as cleaning steps to, in particular, reinforce, if needed, the hydrophilicity thereof.

The two silicon plates 2 are then put into contact and the adhesion 130 is induced; as explained above, the adhesion is not possible on the edge of the silicon plates 2 at the level of the respective chamfer 20 thereof because of the distance between the surfaces. More generally, if the masking substrate 1 has no chamfer or does not have a chamfer to the right of that of the growth plate 2 adhered to the substrate, the chamfer 20 of this plate is remote from the substrate 1.

The protective film 3 made of silicon nitride is deposited 140, for example by chemical vapour deposition in a furnace under sub-atmospheric pressure or LPCVD ("low-pressure chemical vapor deposition"), and in any case, by a technique making it possible to cover at least partially the chamfer 20 of at least one of the two adhered silicon plates 2.

Illustrated only in FIG. 2, for at least one of the two silicon plates 2, the protective film 3 and the additional layer 6 can be removed 154, 156, from the rear face 26, up to exposing a third surface 23, said third surface 23 being, indeed, opposite said first surface 21; this third surface 23 is possibly delimited by what remains of the silicon oxide film 6 and of the silicon nitride film 3 on at least one edge of the plate 2 in question; this removal 154, 156 comprises, if necessary, the grinding of the silicon nitride film 3 and of the silicon oxide film 6, at least perpendicular to said third surface 23. The grinding can be replaced or completed by a chemical-mechanical polishing (CMP) step.

Before or after the removal 154, 156 above, the two silicon plates 2 are removed from one another; thus, two silicon plates 2 potentially have been prepared concurrently for the future epitaxy 160; at this stage, the silicon nitride film 3 delimits the first surface 21 of at least one of the two silicon plates 2 because of the masking of said first surface 21 by the other of the two silicon plates 2 during the deposition 140 of the silicon nitride film 3. The removal can be implemented by any known mechanical and/or chemical and/or thermal and/or photonic means, etc.

On at least one of the two silicon plates 2, the useful zone Zu through epitaxy 160 of the gallium nitride film 4 is only covered, at this stage, by the silicon oxide film 6.

The silicon oxide film 6 perpendicular to said first surface 21 delimited by the silicon nitride film 3, or at least delimited by what remains on the edges of the plates is removed selectively 155; this selective removal 155 comprises preferably the wet etching of the silicon film 6 perpendicular to said first surface 21, for example by a hydrofluoric acid solution.

In particular, before the epitaxy step 160, there can be an interest in proceeding with a cleaning of the first surface(s) 21 of one or of two of the silicon plates 2, respectively, in order to remove the particles present. For example, an RCA (Radio Corporation of America) type cleaning can be proceeded with, limited to an SC-1 (Standard Clean 1) step, comprising an $NH_4OH$—$H_2O_2$-based solution.

At least one of the two silicon plates 2 is thus ready for the deposition by epitaxy 160 of said gallium nitride film 4 at least perpendicular to the first surface 21 thereof.

During the epitaxy 160, a gallium nitride film 4 of good quality is formed on the first surface 21 of at least one of the two silicon plates 2; however, on the chamfer 20 of this plate, this chamfer 20 being covered at least partially by the silicon nitride film 3 and by the silicon oxide film 6, a gallium nitride film 4 of bad quality is formed.

After epitaxy 160, what remains of the silicon nitride film 3 (and the bad quality GaN layer) can be removed 161. This removal 161 can beneficially use the presence of the underlying silicon oxide film 6 as already explained.

After the removal 161 of what remains of the silicon nitride film 3, the bad quality edges of the gallium nitride film 4 can be removed 162, for example mechanically (for example by cutting or by grinding), while keeping a maximum size for the useful zone Zu.

Complementarily to the mechanical techniques making it possible to rectify the edges of the gallium nitride film 4, a chemical attack can be used to remove the stresses and the damage induced by these techniques.

A few precisions are given below, as examples.

The chemical attacks of the silicon oxide film 6 can more specifically be done with a hydrofluoric acid solution with a 50% concentration and/or hot-concentrated.

The deposition 140 of the protective film 3 can be more specifically done by chemical vapour deposition in a furnace under sub-atmospheric pressure at a temperature substantially equal to 750° C. to obtain a thickness substantially equal to 50 nm for this protective film 3.

The generation 125 of the additional layer 6 can be more specifically produced in a furnace under atmospheric pressure at a temperature substantially equal to 950° C. of water vapour to obtain a thickness substantially equal to 140 nm of the additional layer 6.

The deposition of the nucleation layer, at least on the first surface 21 of a plate 2, can be done by metalorganic chemical vapour epitaxy at a temperature substantially of between 1000 and 1200° C., preferably of between 1050 and 1100° C.

The deposition by epitaxy 160 of said gallium nitride film 4 can be more specifically by metalorganic chemical vapour epitaxy at a temperature substantially of between 1000 and 1100° C., preferably substantially equal to 1050° C., to obtain a thickness substantially equal to 3.5 µm of said gallium nitride film 4.

A few embodiment variants described above in reference to FIGS. 1 and 2 are described below.

According to a different embodiment of the embodiments illustrated in FIGS. 1 and 2, the masking substrate 1 is not a growth plate 2. In particular, the substrate can be specific to make it possible for a non-damageable separation method for the useful zone Zu of the growth plate 2.

The masking substrate 1 can, for example, consist of an at least partially plate to make it possible for the removal 150 of the growth plate 2 from the substrate by applying a radiation, preferably laser, at least on one part of said first surface 21 of the growth plate 2 through the substrate 1.

Figure 5:
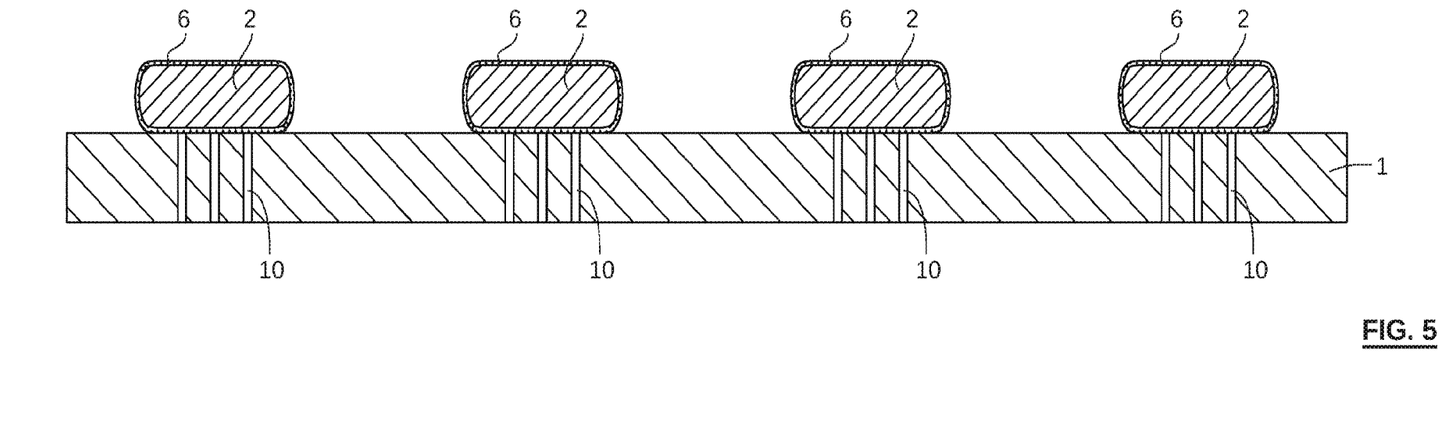
FIG. 5 is a schematic representation of a step of the production method according to another embodiment other than the embodiments of the invention illustrated in FIGS. 1 and 2.

The generation of an additional layer 6 such as described above is not essential for the implementation of the method of the invention; however, the additional layer 6 provides numerous advantages, some of which are described above and of which another advantage consists of being able to consider locally etching in the masking substrate 1 of the vias 10, such as represented in FIG. 5, to make it possible to supply a selective chemical attack solution of the additional layer 6 and to thus make it possible for a chemical removal 150 of the growth plate 2 from the substrate 1.

Moreover, as illustrated in FIG. 5, the masking substrate 1 can be of dimensions greater than the dimensions of the growth plate 2 such that several growth plates 2 can be adhered 130 on the substrate 1.

It is also considered that the masking substrate 1 can be reusable to implement at least once more, the production method 100 by again providing 110 at least one growth plate 2.

Whatever the embodiment considered, each growth plate 2 can be covered initially at least perpendicular to the first surface 21 thereof by a nucleation layer, this layer could be deposited in front of the additional layer 6 or could itself be used as an additional layer 6. This nucleation layer is best suited to the crystalline growth of the epitaxial layer 4 than the first surface 21 of the growth plate 2.

This nucleation layer makes it possible to reduce the chemical reactions between the gallium and silicon of the growth plate 2, leading to a destructive phenomenon of hollowing cavities in the silicon.

Thus, as illustrated in FIG. 3, the production method 100 can comprise, before the adhesion 130 of the growth plate 2 on the masking substrate 1, and more specifically before the generation 125 of the additional layer 6, a step consisting of depositing 124 a nucleation layer comprising at least one aluminium nitride film or aluminium-gallium nitride film, or also silicon carbide (SiC) film. In this case, the generation 125 of the additional layer 6 can be done by depositing (rather than by oxidation on the surface of the plate 2) such that the nucleation layer can be protected by said additional layer 6, in particular during the adhesion 130 and up to the removal 150. The deposition 124 of said nucleation layer can be done by LPCVD or by metalorganic chemical vapour epitaxy at a temperature substantially of between 1000 and 1200° C., preferably of between 1050 and 1100° C.

As seen above, one of the major advantages of the production method 100 according to the invention is that the protective film 3 is self-aligned on the chamfer 20 and that the first surface 21 of the growth plate 2 advantageously corresponds to the useful zone Zu through epitaxy 160, this zone thus being found advantageously maximised. The first surface being automatically delimited by the chamfer 20 of the growth plate 2, the exclusion zone Ze extends over the chamfer, potentially from the first surface 21 of the growth plate 2 and is found minimised, correlatively to the maximisation of the useful zone Zu. It is also possible that the size of the chamfer 20 of the growth plate 2 can be adapted to minimise the exclusion zone and correlatively also further maximise the useful zone Zu.

Concerning the deposition 140 of said at least one protective film 3, several deposition techniques can be considered according to the type of the protective film(s) 3; chemical vapour deposits in a sub-atmospheric pressurised furnace, or LPCVD, in plasma-enhanced chemical vapour deposition (PECVD), physical vapour deposition (PVD), etc.

The silicon nitride film can be replaced by another protective film 3, for example made of silicon oxide. This protective film must be capable of supporting the later heat treatments (and in particular the epitaxy temperature).

In the presence of an underlying additional layer 6, numerous materials can be used to produce the protective film 3 (and in particular, AlN for example) by providing openings to access the additional layer 6. They will be removed, as well as the layer which will have been able to grow above at the moment of the epitaxy by lift-off using the additional layer 6.

It is also possible that the protective film 3 and the additional layer 6 are made of the same material (for example, made of silicon oxide). In this case, rather than the selectivity of etching between the protective film 3 and the additional layer 6, the difference in thickness will be used at the level of the useful zone and of the complementary zone to adjust the etching time and conserve the material at the level of the complementary zone only while making bare the growth plate 2 (or the possible nucleation layer) at the level of the useful zone.

The direct adhesion 130 methods include the various surface preparation, cleaning, adhesion atmospheres, plate contact, pre-adhering heat treatment variants, etc. The contact of the plates can be made manually or automatically. The growth plates 2 can be aligned before adhesion so as to minimise the exclusion zone Ze and maximise the useful zone Zu; this alignment can be mechanically done or by means of alignment marks.

The removal 150 of the growth plates 2 can be done, furthermore by chemical attack, by a mechanical force, for example by inserting a corner, applied locally or on the perimeter of the surfaces adhered to one another, and/or in an atmosphere which favours (or not) the removal 150.

The removals are done mechanically and/or chemically, in a dry, gaseous or liquid method, among which grinding, dry polishing, CMP, chemical liquid solution attacks, chemical etchings by specific atmospheres, plasma or ion beam etchings, etc. can be cited.

The removal 154, 156 of said at least one protective film 3, and possibly of said additional layer 6, in the rear face 26 of the growth plate 2 can be done before or after removal 150 of the plates. In particular, the removal 154, 156 can be difficult by a CMP (or other technique) on a structure of two adhered plates (since the thickness of the adhered structure is the total of that of the two plates). Thus, for this removal 154, 156, it can be preferable to remove the plates 2, then to make the removal 154, 156 (by CMP or other technique) on each of the plates 2 separately.

The invention is not limited to the embodiments described above, and extends to all embodiments covered by the claims.

The invention claimed is:

1. A method for producing an epitaxial layer on at least one growth plate, the method comprising:
   (i) adhering at least one growth plate comprising a chamfer on a masking substrate, such that the masking substrate masks a first surface and exposes a second surface of said at least one plate, said second surface comprising the chamfer and said first surface being at least partially delimited by the chamfer,
   (ii) after said adhering, depositing at least one protective film, at least on one part of the chamfer of said at least one growth plate,
   (iii) removing said at least one growth plate from the masking substrate, and
   (iv) after said removing, depositing the epitaxial layer from said first surface of said at least one growth plate.

2. The method according to claim 1, wherein the masking substrate is of dimensions greater than the dimensions of said at least one growth plate such that several growth plates are adhered during said adhering (i) on the substrate.

3. The method according to claim 1, wherein the substrate is transparent so that said removing (iii) is carried out by applying a radiation, at least over one part of said first surface through the masking substrate.

4. The method according to claim 1, wherein,
   said masking substrate is a growth plate comprising a chamfer, and
   the method comprises:
   adhering two growth plates, each of which comprises a chamfer, on one another, such that each growth plate masks a first surface and exposes a second surface of the other of the two growth plates, the second surface of each growth plate comprising the chamfer of this growth plate and the first surface of each growth plate being at least partially delimited by the chamfer of this plate,
   depositing said at least one protective film at least over one part of the chamfer of at least one of the two growth plates,
   removing said growth plates from one another, and
   depositing by epitaxy at least one epitaxial layer from the first surface of at least one of the two growth plates.

5. The method according to claim 1, wherein said adhering (i) is done such that said first surface is maximal.

6. The method according to claim 1, wherein said adhering (i) is done by direct adhesion.

7. The method according to claim 1, wherein said at least one protective film comprises at least one nitride film, or an oxide film.

8. The method according to claim 1, further comprising:
   before said adhering (i) depositing at least one nucleation layer comprising a film of a nitride selected from the group consisting of aluminium nitride (AlN), indium nitride (InN), aluminium-gallium nitride (AlGaN), and indium-gallium nitride (InGaN) at least on the first surface of said at least one growth plate.

9. The method according to claim 1, further comprising:
   before said adhering (i), generating an additional layer at least perpendicular to the first surface of said at least one growth plate, and
   after said removing (iii) and before said depositing (iv), removing the additional layer perpendicular to said first surface.

10. The method according to claim 9, further comprising:
    before said generating, depositing at least one nucleation layer comprising a film of a nitride selected from the group consisting of aluminium nitride (AlN), aluminium-gallium nitride (AlGaN) and silicon carbide (SiC), at least on the first surface of said at least one growth plate.

11. The method according to claim 9, wherein said adhering (i) is preceded by a smoothing of the additional layer.

12. The method according to claim 9, further comprising:
    after said adhering (i) and before said depositing (ii), removing the additional layer.

13. The method according to claim 9, wherein said masking substrate comprises vias allowing the supply, up to the additional layer situated perpendicular to the first surface of a chemical attack solution of the additional layer.

14. The method according to claim 9, further comprising:
    after said depositing (iv), removing at least what remains of said at least one protective film up to exposing the whole surface of said at least one growth plate not covered by said epitaxial layer,
    wherein said removing comprises etching by a chemical attack solution from what remains of the additional layer.

15. The method according to claim 1, wherein
    said depositing (ii) comprises deposition of said at least one protective film on a rear face of the growth plate opposite a front face comprising said first surface, and
    the method comprises, after said removing (iii) and before said depositing (iv): removing, from said rear face, at least said at least one protective film up to exposing a third surface of said at least one growth plate opposite said first surface.

16. The method according to claim 1, wherein said depositing (iv) is preceded with a cleaning of at least the first surface of said at least one growth plate.

17. The method according to claim 1, further comprising:
after said depositing (iv), removing at least what remains of said at least one protective film up to exposing the whole surface of said at least one growth plate not covered by said epitaxial layer.

18. The method according to claim 17, wherein
the epitaxial layer covering by the edges thereof partially at least one protective film itself covering the chamfer, and
the method comprises, after said removing of what remains of said at least one protective film, removing the edges of the epitaxial layer.

* * * * *